United States Patent [19]
Sikorski, Jr.

[11] Patent Number: 5,967,814
[45] Date of Patent: Oct. 19, 1999

[54] ADJUSTABLE ANGLE EXTENDER CARD

[75] Inventor: Theodore Joseph Sikorski, Jr., Hamilton, N.J.

[73] Assignee: Lucent Technologies Inc., Murray Hill, N.J.

[21] Appl. No.: 09/094,325

[22] Filed: Jun. 9, 1998

[51] Int. Cl.$^6$ ........................................................ H01R 3/00
[52] U.S. Cl. ............................ 439/165; 439/945; 206/706
[58] Field of Search ............................. 439/31, 165, 945; 206/706; 211/41.17

[56] References Cited

U.S. PATENT DOCUMENTS

| | | | |
|---|---|---|---|
| 3,764,857 | 10/1973 | Bartlett et al. | 317/101 DH |
| 4,877,409 | 10/1989 | Tanigawa et al. | 439/31 |
| 5,531,328 | 7/1996 | Rochelo et al. | 206/706 |

*Primary Examiner*—Steven L. Stephan
*Assistant Examiner*—Vincent Johnson

[57] ABSTRACT

An adjustable angle extender card is used to hot-test a circuit pack having electrical connectors that connect to back plane electrical connectors in an electrical cabinet when the circuit pack is inserted into the electrical cabinet. The extender card comprises a rigid basic board that can be inserted into the electrical cabinet and a rigid circuit pack card guide that accepts the circuit pack. The basic board includes plural replication electrical connectors, arranged along one edge of a substrate, for connection to the back plane electrical cabinet connectors when the basic board is inserted into the electrical cabinet, and plural basic board electrical connectors arranged along an opposite edge of the substrate. Corresponding replication connectors and basic board connectors are electrically connected. The card guide includes plural emulation electrical connectors disposed proximate to an edge of the card guide for connection to the circuit pack electrical connectors when the circuit pack is in the card guide. The basic board and the card guide are hinged together at the edges where the connectors are disposed so that the angle between the basic board and the card guide can be adjusted. A flexible electrical cable electrically connects corresponding replication and emulation connectors to permit adjustment of the relative angular orientation of the basic board and the card guide.

11 Claims, 3 Drawing Sheets

ADJUSTABLE ANGLE EXTENDER CARD

BACKGROUND OF THE INVENTION

1. Field of the Invention

The present invention relates to an extender card used when testing a circuit pack, and more particularly to an adjustable extender card capable of holding the circuit pack in a desired orientation during testing.

2. Description of Related Art

Extender cards are conventional devices that permit testing of circuit boards or packs under operative conditions, known in the art as "hot-testing."

Conventional extender cards are rigid and emulate the connections at the back plane of an electrical cabinet in which multiple circuit packs are mounted for operation. The extender cards in effect relocate electrical cabinet back plane connectors to a location closer to the front of the cabinet. As a result, the circuit pack is accessible to a technician while it is connected in the cabinet in the same manner as it would be during operation.

To that end, a conventional extender card includes unitary basic board and card guide portions. The basic board portion has at one edge connectors that serve to replicate the connections at the back of the circuit pack. Connectors that serve to emulate the connections at the back plane of the electrical cabinet are spaced apart from the replication connectors. The emulation connectors are electrically connected on a one-to-one basis to the replication connectors. The card guide portion guides the connectors at the rear of the circuit pack into contact with the emulation connectors. Accordingly, the connectors on the circuit pack mate with the emulation connectors just as if the emulation connectors were the back plane connectors in the electrical cabinet.

In use, a circuit pack to be tested is withdrawn along circuit pack mounting guides in the electrical cabinet. The basic board portion of the extender card, which has guide rails like the circuit pack, is slid into the electrical cabinet until the replication connectors on the back edge of the basic board portion mate with the electrical cabinet back plane connectors. With the extender card in this position, the card guide portion of the extender card protrudes from the cabinet. The card guide portion has guides that simulate the guides in the electrical cabinet. A technician slides the circuit pack along those guides until the circuit pack connectors mate with the emulation connectors. In this manner the circuit pack is accessible for testing under conditions identical to those it experiences when in place in the electrical cabinet.

However, although the conventional extender card is an extremely useful tool, it is limited because multiple circuit packs cannot be tested at the same time unless they are sufficiently spaced apart in the electrical cabinet.

SUMMARY OF THE INVENTION

It is an object of the present invention to provide an extender card that enables multiple components, such as circuit packs mounted in an electrical cabinet, to be tested simultaneously regardless of their relative location in the cabinet.

In accordance with one aspect of the invention, an extender card, for use in testing a component having electrical connectors for connecting to mating electrical connectors in an electrical cabinet when the component is inserted into the electrical cabinet, comprises a basic board for insertion into the electrical cabinet, wherein the basic board includes replication electrical connectors for connection to the electrical cabinet connectors when the basic board is inserted into the electrical cabinet, a component card guide for accepting the circuit pack, wherein the card guide includes emulation electrical connectors for connection to the component electrical connectors when the component is accepted by the card guide, mounting means for mounting the basic board and the card guide together to permit change of the relative orientation thereof, and an electrical connector for electrically connecting the replication electrical connectors and the emulation electrical connectors while the relative orientation of the basic board and the card guide are changed.

In accordance with another aspect of the invention, an adjustable angle extender card, for use in testing a component having electrical connectors for connecting to mating back plane electrical connectors in an electrical cabinet when the component is inserted into the electrical cabinet, comprises:

- a basic board for insertion into the electrical cabinet, the basic board including a substantially rigid, generally planar, rectangular substrate, plural replication electrical connectors arranged along one edge of the substrate for connection to the back plane electrical cabinet connectors when the basic board is inserted into the electrical cabinet, plural basic board electrical connectors arranged along an opposite edge of the substrate, and electrical wiring connecting corresponding ones of the replication electrical connectors and corresponding ones of the basic board connectors;
- a generally planar component card guide for accepting the component, the card guide including plural emulation electrical connectors disposed proximate to a first edge of the card guide for connection to the component electrical connectors when the component is accepted by said card guide;
- hinge means mounted to the basic board proximate to the opposite edge thereof and to the card guide proximate to said first edge thereof for permitting rotation of the basic board and the card guide about an axis parallel to the respective planes of the basic board and the card guide;
- securing means for fixing the basic board and the card guide in a desired relative angular orientation; and
- a flexible, flat electrical cable disposed in a plane parallel to the axis for electrically connecting corresponding basic board electrical connectors and corresponding emulation electrical connectors while the relative angular orientation of the basic board and the card guide is changed.

BRIEF DESCRIPTION OF THE DRAWINGS

The present invention will be better understood from the detailed description of its preferred embodiments which follows below, when taken in conjunction with the accompanying drawings, in which like numerals refer to like features throughout. This brief identification of the drawing figures will aid in understanding the detailed description that follows.

DETAILED DESCRIPTION OF THE PREFERRED EMBODIMENTS

Figure 1:
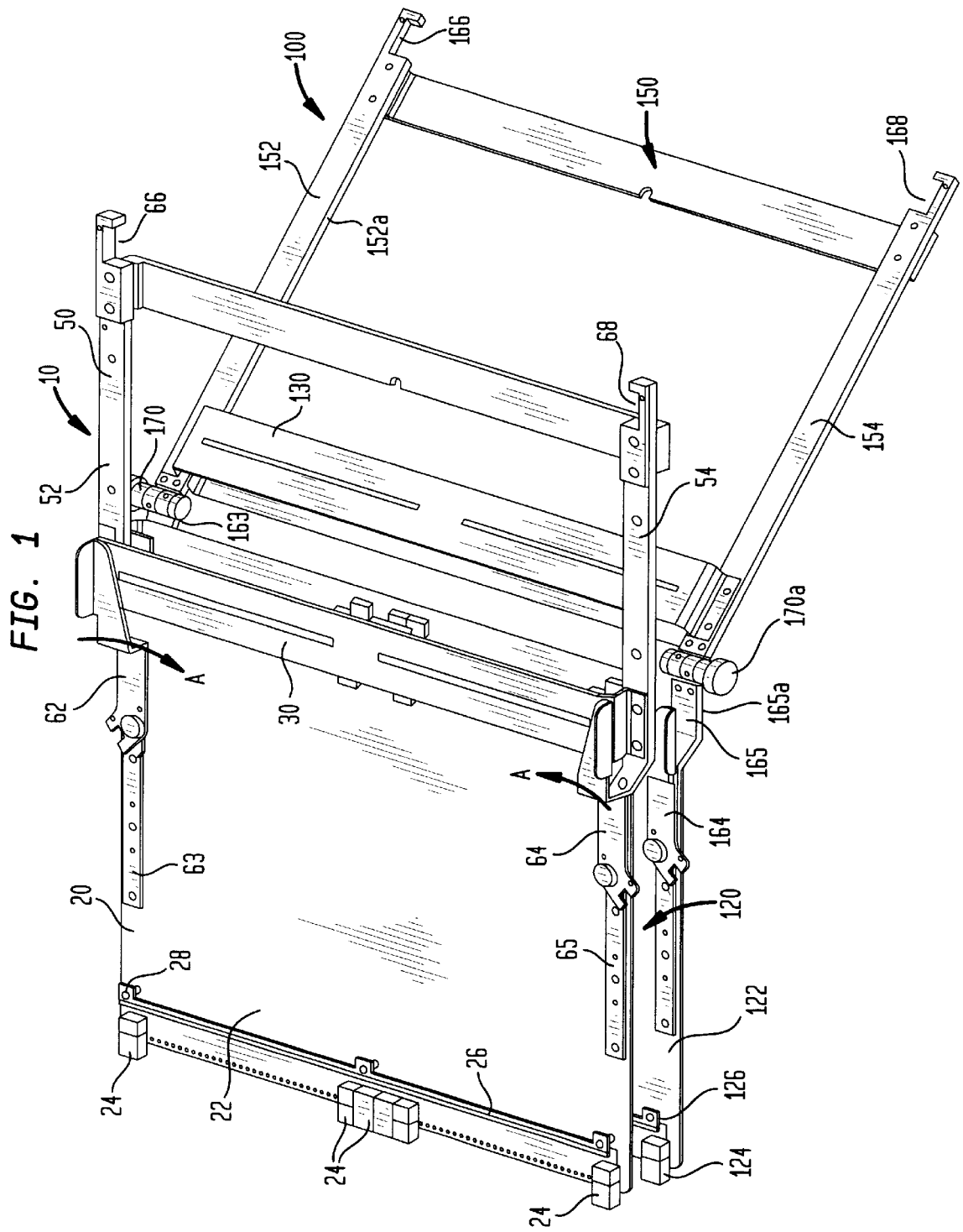
FIG. 1 is a perspective view of a prior art rigid extender card juxtaposed with an adjustable angle extender card in accordance with an embodiment of the present invention.

FIG. 1 shows how the present invention provides a device that enables more than one component, such as a circuit pack, in an electrical cabinet to be hot-tested at the same time. An electrical cabinet with which the present invention is particularly adapted for use has numerous printed circuit boards or other self-contained electric circuit modules known as circuit packs, arranged close together in face-to face relation. The circuit packs can be stacked vertically, or arranged side-by-side, but they are typically placed very close together, sometimes with spacing as small as one millimeter, to enable as many circuit packs as possible to fit into a single electrical cabinet.

Such circuit packs are mounted in the cabinet in slots that extend from the front of the cabinet to a back plane at which connector pins are located. The circuit pack has cooperating connectors that are guided into and connect electrically with the cabinet back plane pins as the circuit pack slides into the cabinet.

FIG. 1 illustrates a conventional rigid circuit pack extender card 10 juxtaposed with an adjustable angle extender card 100 in accordance with the present invention.

The conventional extender card 10 includes a basic board portion 20 and a unitary circuit pack card guide portion 50. The basic board 20 includes a rigid, substantially planar substrate 22 that is made of several layers that are bonded together to enhance the rigidity of the substrate. A series of replicating connectors 24 are mounted across the back edge of the substrate 22 to replicate the contacts at the rear of the circuit pack. As such, the replicating connectors 24 provide receptacles for pins at the back plane of the electrical cabinet (not shown). The replicating connectors 24 are connected to the substrate and may be placed along the entire back edge of the substrate 22 or just at selected locations. A stiffener 26 is secured to the substrate 22 by suitable fasteners such as screws 28.

A shroud assembly 30 is attached to an opposing edge of the substrate 22. The details of the shroud assembly will be clearer from the discussion further below, but suffice it to say here that within the shroud assembly a series of male emulating connectors extends along the front edge of the substrate in the same manner as the replicating connectors 24 along the back edge of the substrate. Sockets in the replicating connectors 24 are electrically connected one-by-one to pins in the emulating connectors in the shroud assembly 30 by electrical wiring within the laminated substrate 22. As such, the emulating connectors emulate the back plane connectors in the electrical cabinet.

The circuit pack card guide portion 50 includes side rails 52 and 54. These side rails simulate the slots in the electrical cabinet that serve to guide the circuit pack into proper alignment with the connectors at the back plane of the electrical cabinet. At this point, it will be appreciated that when the circuit pack is removed from the electrical cabinet, it can be replaced with the extender card 10 by sliding the basic board portion 20 into the cabinet until the replicating connectors 24 mate with the back plane connectors in the cabinet. The circuit pack is then mounted on the card guide 50 until the connectors at the rear of the circuit pack receive the pins of the emulating connectors within the shroud assembly 30. The circuit pack is exposed outside of the cabinet and is connected to the electrical cabinet exactly as if it were fully inserted into the cabinet, and therefore can be tested under power.

One side of the substrate has a latch lever 62 mounted for rotation on a side plate 63 attached by rivets to the substrate 22. The other side of the substrate has a similar latch lever 64 mounted for rotation on a side plate 65 also attached by rivets to the substrate 22. These latch levers emulate similar levers on the circuit pack that lock the circuit pack in place when it is in position in the electrical cabinet. The latch levers 62 and 64 are maintained in the retracted position shown in FIG. 1 as the extender card 10 is inserted into the cabinet. Then, when it is fully inserted, the levers 62 and 64 are pivoted in the direction of the arrows A to a locking position in which they engage locking structure in the cabinet to lock the card in place. By the same token, the rails 52 and 54 of the card guide 50 have cutouts 66 and 68 that emulate the locking structure in the electrical cabinet. These cutouts 66 and 68 accept the locking levers on the circuit pack that correspond to the latch levers 62 and 64. It will be recognized by those familiar with this art that locking and latch levers may be disposed on only one side of the basic board and circuit card, instead of on both sides as depicted in FIG. 1.

The conventional extender card is a convenient device for testing a circuit pack under power-on conditions. However, circuit packs are typically very closely spaced in electrical cabinets, in some cases on the order of about 1 mm apart. FIG. 1 illustrates the difficulty that would be encountered in simultaneously trying to test multiple closely positioned circuit packs using conventional extender cards 10.

The present invention overcomes that problem in the prior art by providing an adjustable extender card 100. To facilitate understanding of the embodiment of the invention depicted in the drawings, reference numerals for the depicted embodiment of the invention are given "100" numbers for parts that correspond to parts discussed above in the conventional extender card.

The extender card 100 of the present invention includes a basic board 120 and a separate card guide 150. The basic board 120 is built on a substrate 122 that has a stiffener 126 at its rear edge. The basic board has replication connectors 124 that correspond to the connectors 24 on the conventional card 10. The basic board 120 of the extender card 100 includes latch levers 162 and 164 (see FIG. 2 also) that lock the extender card 100 in place in the electrical cabinet. In the same vein, the separate card guide 150 includes side rails 152 and 154 that guide the circuit pack into place, as described above in connection with rails 52 and 54. The cutouts 166 and 168 cooperate with locking levers on the circuit pack, as described above in connection with cutouts 66 and 68.

Figure 2:
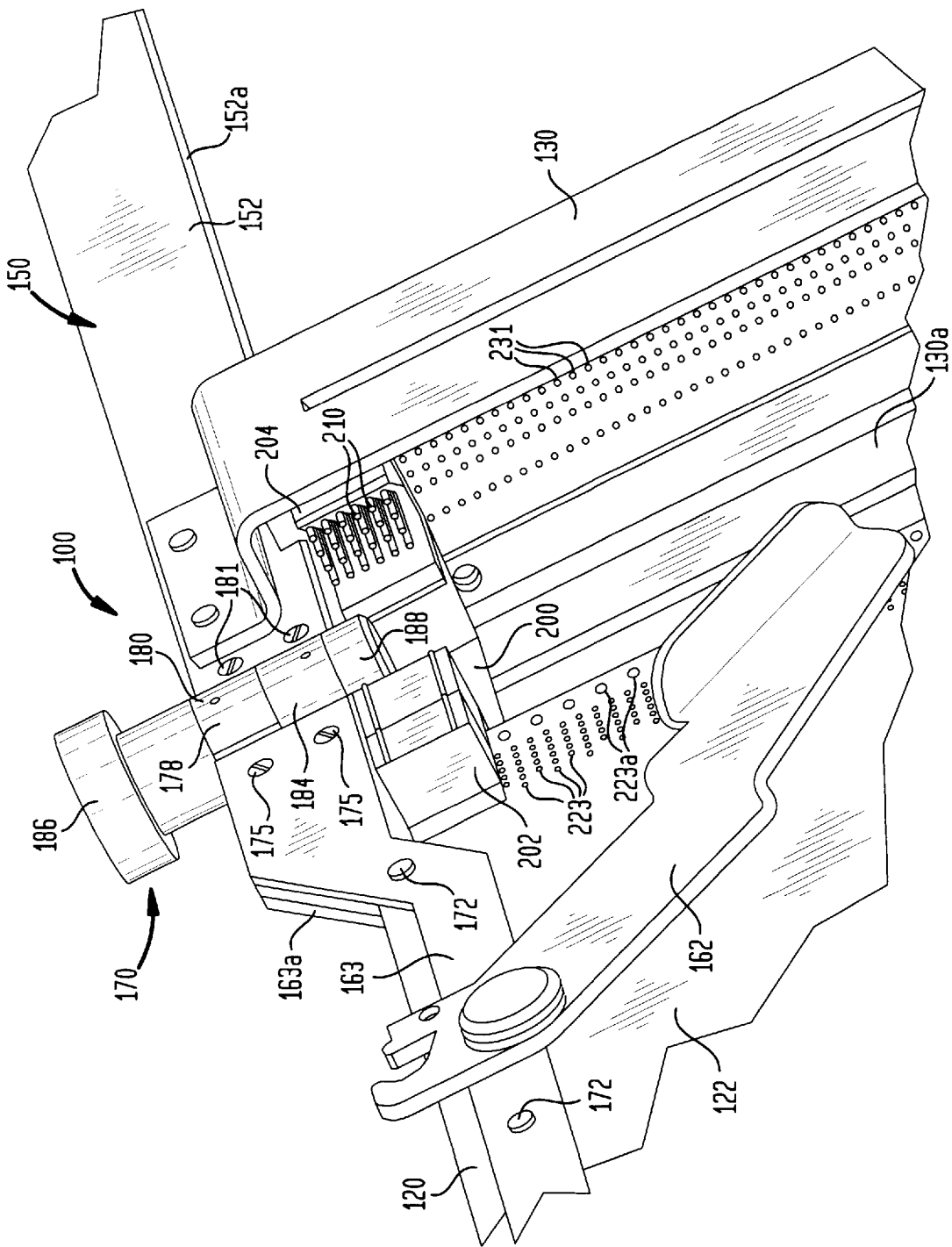
FIG. 2 is an enlarged perspective view of a portion of the adjustable angle extender card shown in FIG. 1.
Figure 3:
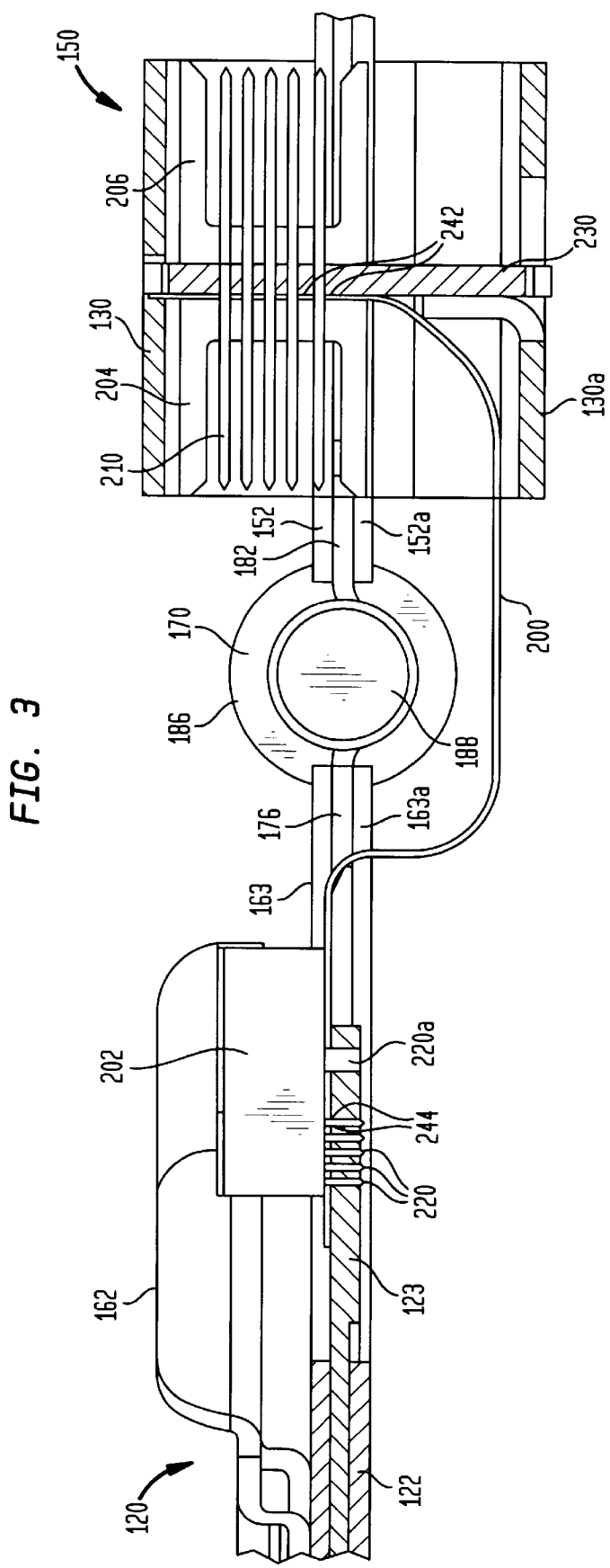
FIG. 3 is a cross-sectional view showing the connections of the flexible cable between the basic board and the circuit pack card guide of the embodiment of the present invention shown in FIG. 2.

A salient feature of the present invention is that the basic board 120 and the card guide 150 are mounted for movement relative to each other so that their relative orientation may be adjusted by a user. In the present embodiment they are connected for rotation at hinges 170 and 170a. FIGS. 2 and 3 show the structure of the hinge 170 in greater detail.

The basic board 120 has on its top surface a side plate 163 extended to form a basic board top hinge plate and on its bottom surface a side plate 163a extended to form a basic board bottom hinge plate. (Directional or positional terms such as "bottom," "top" and the like are used herein for convenience in describing the depicted embodiment of the invention. Those terms refer to the orientation of the described extender card as depicted in the drawings, and use herein of such terms should not be taken as limiting the invention in any way). There are identical, but mirror image side plates 165 and 165a that form basic board hinge plates associated with the hinge 170a on the other side of the card 100 (see FIG. 1). The basic board hinge plates are attached to the substrate 122 by rivets 172.

The circuit pack card guide 150 includes two side rails on each side that provide slots that guide the circuit pack into place in the extender card, as described above. FIG. 2 illustrates that top and bottom side rails 152 and 152a comprise hinge plates for the card guide 150. Again, there are identical, but mirror image circuit pack side rails/hinge plates associated with the hinge 170a on the other side of the extender card 100 (see FIG. 1).

The hinge 170 includes a basic board hinge member 174 bolted by screws 175 between the hinge plates 163 and 163a. The hinge member 174 includes a hinge plate 176 having an integral hinge loop 178. The hinge 170 also includes a card guide hinge member 180 bolted by the screws 181 between the hinge plates 152 and 152a. The hinge member 180 includes a hinge plate 182 having an integral hinge loop 184. A knob 186 has a threaded axial bore that accepts a threaded, reduced diameter portion of a hinge pin 188 that extends through the hinge loops 178 and 184.

The hinge pin 188 is secured against rotation relative to the hinge loop 184 by a pin 190, so that when the knob 186 is turned by the user, the hinge loops 178 and 184 are drawn together and are secured against rotation relative to each other. By also tightening the knob 170a, the circuit pack card guide 150 is fixed in a desired angular position relative to the basic board 120. To assist in securing the circuit pack card guide 150 relative to the basic board 120, the facing surfaces of the hinge loops can be grooved to provide face gears that will more positively lock the circuit pack card guide 150 relative to the basic board 120.

It will be appreciated by those skilled in the art that arrangements other than a hinge can be used to provide relative movement between the basic board 120 and the circuit pack card guide 150. That is, it is within the scope of the present invention to mount the basic board and the card guide together with any mechanism that permits changing their orientation relative to each other. It is merely in connection with one embodiment that the invention is described as comprising a basic board and card guide secured to each other so that the angle between the planes in which they lie is adjustable.

In the depicted embodiment a flexible electrical cable 200 provides an electrical connection between the basic board 120 and the card guide 150. The flexible cable 200 is omitted in FIG. 1 for clarity. FIG. 2 shows a preferred embodiment of the cable, in which it is a flat cable, parallel to the axes of the hinges 170 and 170a, that extends for the entire width of the extender card. However, it is within the scope of the present invention to use multiple flexible cables, as discussed in more detail below. The flexible cable will typically have conductors at different levels within the cable, as is known in the prior art.

FIG. 3 is a cross-sectional view showing the area between the basic board 120 and the card guide 150 depicted in perspective in FIG. 2. The basic board 120 has female basic board connectors 202 and the card guide 150 includes male shroud connectors 204 and header emulation connectors 206. In the conventional extender card the basic board connectors 202 accept the pins 210 in the shroud connectors 204 and emulation connectors 206 when the basic board 20 and card guide 50 are assembled into the unitary extender card 10 (see FIG. 1) to enable hot-testing of the circuit pack as discussed above.

The basic board connectors 202 are conventional and include depending pins 220 that are electrically connected with a printed circuit board 123, which is laminated as part of the substrate 122 and provides a one-to-one correspondence with the corresponding replication connectors 124 at the back edge of the basic board 120 (see FIG. 1). The depending pins 220 extend through holes in the cable 200 and holes 223 in the printed circuit board 123 and are suitably secured to the conductors on the printed circuit board by press-fitting them into openings in the cable and the printed circuit board. Alternatively, the electrical connection between the pins and the circuit board can be made in other ways, such soldering, for example. The connectors may also have depending indexing pins 220a that cooperate with locating holes 223 (see FIG. 2) to position the connectors during assembly to the basic board and prevent undue stress on the pins 220. The pins 220 are in turn connected to the sockets (not shown) in the connectors 202, again on a one-to-one basis. In this fashion, the connectors 202 duplicate the connectors 124 at the rear edge of the basic board 120. The shroud connectors 204 and the header emulation connectors 206 are also conventional. They are secured to an interface backplane 230 that is part of the upper shroud 130 and the lower shroud 130a and that has holes 231 (see FIG. 2) through which the pins 210 extend. The connections with the pins 210 at the backplane 230 can also be either press-fit or soldered, as described above.

The flexible cable 200 has a series of conductors that traverse the cable between the basic board 120 and the card guide 150. The cable conductors terminate at one end at eyelets 242, through which the pins 210 extend, and at the other end at eyelets 244 through which the depending pins 220 extend. The conductors correspond on a one-to-one basis with the pins 210 and the pins 220. The electrical connections between the pins and the electrical cable can likewise be by press-fitting or soldering.

In operation, the user unlatches the levers on the circuit pack to be tested and withdraws it from the electrical cabinet. The basic board 120 of the extender card 100 is inserted into the electrical cabinet in place of the circuit pack. This is possible because the edges of the basic board simulate the edges of the circuit pack and the basic board therefore slides along the slots in the electrical cabinet just as the circuit pack does. The latches 162 and 164 are extended to lock the basic board in place in the same manner as the circuit pack is locked into place in the cabinet. The circuit pack card guide 150 is then positioned angularly in the desired location and the knobs 170 and 170a are tightened to secure the card guide in the desired orientation.

It will be appreciated that this orientation can be varied to suit the circumstances under which the circuit pack is being tested. For example, it can be oriented as shown in FIG. 1 if the circuit pack immediately above it is being tested using a conventional rigid extender card. It is also possible to mount and test multiple circuit packs by using multiple adjustable extender cards in accordance with the present invention.

Those skilled in the art will appreciate that other modifications to the structure described above can be made. For example, the connections between the conductors in the flexible cable and the connectors on the basic board and the card guide can be made by presoldering the flexible cable and then reflowing the solder when the flexible cable is in place. It will also be appreciated that the connectors themselves can take other forms than those shown in the drawings. The connectors shown herein are advantageous because they are used for the prior art extender card, which enables implementation of the present invention without the necessity of engineering wholly new connectors. To carry out the objects of the present invention it is only necessary that the emulation connectors on the card guide be wired so that they duplicate the connectors at the back plane of the electrical cabinet.

Other modifications to the embodiment depicted in the drawings are also possible without departing from the spirit of the invention. For example, the hinges 170 and 170a can modified to have a single hinge pin that extends the entire distance between the hinges, instead of using separate hinge pins for each hinge. In fact, the mounting means mounting the basic board and card guide together need not be a hinge. The present invention contemplates the use of any mounting mechanism that permits change of the relative orientation of the basic board and card guide.

In addition, the flexible cable need not be in one piece and extend the entire width of the basic board and the card guide. While that arrangement facilitates assembly of the extender 100, it also requires that a number of different cables be available for different width extender cards that are typically used in available electrical cabinets. Accordingly, a single width flat cable could be kept on hand, in which case different numbers of such cables would be used to span different width extender cards. Of course, the electrical connection means that allows the relative position of the basic board and card guide to be changed need not even be a flexible cable. Any such connection that performs that function is within the scope of the present invention.

While preferred embodiments of the invention have been depicted and described, it will be understood that various changes and modifications can be made other than those specifically mentioned above without departing from the spirit and scope of the invention, which is defined solely by the claims that follow.

What is claimed is:

1. An extender card for use in testing a component having electrical connectors for connecting to mating electrical connectors in an electrical cabinet when the component is inserted into the electrical cabinet, the extender card comprising:

a basic board for insertion into the electrical cabinet, wherein said basic board includes replication electrical connectors for connection to the electrical cabinet connectors when said basic board is inserted into the electrical cabinet;

a component card guide for accepting the component, wherein said card guide includes emulation electrical connectors for connection to the component electrical connectors when the component is accepted by said card guide;

a mounting mechanism for mounting said basic board and said card guide together to permit change of the relative orientation thereof; and an electrical connector for electrically connecting said replication electrical connectors and said emulation electrical connectors while the relative orientation of said basic board and said card guide are changed.

2. An extender card as in claim 1, wherein said mounting mechanism comprises hinge means for permitting relative rotation of said basic board and said card guide about an axis.

3. An extender card as in claim 2, wherein:

said basic board has a generally rectangular planform with said contact electrical connectors disposed along one side of said basic board planform;

said card guide has a generally rectangular planform with said replication electrical connectors disposed along a first side of said card guide planform; and said hinge means is disposed proximate to a side of said basic board planform opposite to said one side and proximate to said first side of said opposite side of card guide.

4. An extender card as in claim 3, wherein said electrical connector comprises a flat electrical cable generally disposed in a plane parallel to said axis.

5. An extender card as in claim 4, wherein said flat electrical cable extends along substantially the entire length of said opposite side of said basic board planform and substantially along the entire length of said first side of said card guide planform.

6. An adjustable angle extender card for use in testing a component having electrical connectors for connecting to mating back plane electrical connectors in an electrical cabinet when the component is inserted into the electrical cabinet, the extender card comprising:

a basic board for insertion into the electrical cabinet, said basic board including:
        a substantially rigid, generally planar, rectangular substrate,
        plural replication electrical connectors arranged along one edge of said substrate for connection to the back plane electrical cabinet connectors when said basic board is inserted into the electrical cabinet,
        plural basic board electrical connectors arranged along an opposite edge of said substrate, and
        electrical wiring connecting corresponding ones of said replication electrical connectors and corresponding ones of said basic board connectors;

a generally planar component card guide for accepting the component, said card guide including plural emulation electrical connectors disposed proximate to a first edge of said card guide for connection to the component electrical connectors when the component is accepted by said card guide;

hinge means mounted to said basic board proximate to said opposite edge thereof and to said card guide proximate to said first edge thereof for permitting rotation of said basic board and said card guide about an axis parallel to the respective planes of said basic board and said card guide;

securing means for fixing said basic board and said card guide in a desired relative angular orientation; and a flexible, flat electrical cable disposed in a plane parallel to said axis for electrically connecting corresponding said basic board electrical connectors and corresponding said emulation electrical connectors while the relative angular orientation of said basic board and said card guide is changed.

7. An adjustable angle extender card as in claim 6, wherein:

said hinge means comprises a first hinge proximate to one end of said opposite edge of said basic board and of said first edge of said card guide and a second hinge proximate to another end of said opposite edge of said basic board and of said first edge of said card guide; and said securing means is manually operable to secure said first hinge and said second hinge in a desired relative position.

8. An adjustable angle extender card as in claim 7, wherein:
   each of said first and second hinges includes a knob mounted on a hinge pin about which said corresponding hinge is rotatable; and
   each said knob is capable of being manually tightened to secure said corresponding hinge in a desired position.

9. An adjustable angle extender card as in claim 6, wherein:
   said flat electrical cable extends along substantially the entire length of said opposite edge of said basic board and substantially along the entire length of said first edge of said card guide and includes a first plurality of eyelets extending substantially the entire width of said cable proximate to one end thereof and a second plurality of eyelets disposed proximate to another end of said cable and electrically connected to corresponding ones of said first eyelets by conductors within said cable;
   said basic board electrical connectors each comprise a plurality of depending pins extending through and electrically connected to said eyelets at one end of said cable and into sockets in said substrate electrically connected to said electrical wiring therein; and
   said emulation electrical connectors each comprise a plurality of pins extending through and electrically connected to said eyelets at said other end of said cable, said pins being disposed to accept the component electrical connectors when the component is accepted by said card guide.

10. An adjustable angle extender card as in claim 9, wherein said eyelets are press-fit to said depending pins of said basic board electrical connectors and to said pins of said emulation connectors.

11. An adjustable angle extender card as in claim 9, wherein said eyelets are soldered to said depending pins of said basic board electrical connectors and to said pins of said emulation connectors.

* * * * *